(12) United States Patent
Liu

(10) Patent No.: US 7,359,811 B1
(45) Date of Patent: Apr. 15, 2008

(54) PROGRAMMABLE LOGIC DEVICE WITH POWER SUPPLY NOISE MONITORING

(75) Inventor: Hui Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 160 days.

(21) Appl. No.: 11/153,984

(22) Filed: Jun. 16, 2005

(51) Int. Cl.
*G05F 1/40* (2006.01)

(52) U.S. Cl. .......................................... 702/69; 326/38

(58) Field of Classification Search ................. 702/38, 702/58–59, 182–185, 188, 64, 69; 324/76.11; 326/38, 63, 80
See application file for complete search history.

(56) References Cited

U.S. PATENT DOCUMENTS

| | | | |
|---|---|---|---|
| 5,550,840 A | | 8/1996 | O'Brien |
| 5,760,571 A | * | 6/1998 | Latham et al. ............... 323/274 |
| 6,628,135 B2 | | 9/2003 | Gauthier |
| 6,788,098 B1 | | 9/2004 | Alani et al. |
| 6,823,293 B2 | | 11/2004 | Chen et al. |
| 7,046,571 B2 | * | 5/2006 | Kim et al. ................... 365/226 |
| 2007/0046325 A1 | * | 3/2007 | Balasubramanian et al. .. 326/38 |

* cited by examiner

*Primary Examiner*—Edward Raymond
(74) *Attorney, Agent, or Firm*—G. Victor Treyz

(57) ABSTRACT

Programmable logic device power supply noise levels are characterized using internal measurements. By making power supply noise measurements internally, noise measurements are made without influence from device packaging or circuit board environmental effects. The input-output circuitry of a programmable logic device is configured to supply a power supply voltage from the output of an output buffer to one of the inputs of a differential input buffer. The other of the inputs of the differential input buffer is provided with a reference voltage from an external voltage reference circuit. The differential input buffer serves as a comparator and generates an output signal based on a comparison of the power supply voltage from the output buffer and the reference voltage. A noise monitoring circuit processes the output of the input buffer. The noise monitoring circuit may be based on a register.

20 Claims, 14 Drawing Sheets

PROGRAMMABLE LOGIC DEVICE WITH POWER SUPPLY NOISE MONITORING

BACKGROUND

This invention relates to programmable logic device integrated circuits, and more particularly, power supply noise monitoring in programmable logic devices.

Programmable logic devices are a type of integrated circuit that can be programmed by a user to implement a desired custom logic function. In a typical scenario, a logic designer uses computer-aided design tools to design a custom logic circuit. These tools use information on the hardware capabilities of a given programmable logic device to help the designer implement the custom logic circuit using the resources available on that device. When the design process is complete, the tools generate configuration data files. The configuration data is loaded into programmable logic devices to configure them to perform the desired custom logic function.

Logic designers must take power supply noise effects into account when designing circuitry for programmable logic devices. Particularly at high switching speeds, noise effects such as simultaneous switching noise (SSN) can adversely affect circuit performance. Simultaneous switching noise (SSN) affects circuits when a number of signals switch simultaneously. When a significant number of signals switch simultaneously, the value of the ground voltage can rise and the value of the positive power supply voltage can drop. These SSN effects, which are referred to as ground bounce and Vcc sag, may be significant enough that the digital data passing through the circuit becomes corrupted.

It is generally not possible to probe the power supply voltages on internal nodes in a programmable logic device integrated circuit. As a result, noise characterization measurements are typically made by routing internal power supply signals to external pins. By measuring the noise on these pins, a logic designer can determine how much noise margin exists in a given circuit design.

The noise characterization information that is gathered in this way can be used in optimizing the design. However, noise measurements made by routing internal signals through the device's package and the circuit board on which the device is mounted can be strongly influenced by the package and circuit board environment. Conventional power supply noise measurement arrangements are therefore often inaccurate.

It would therefore be desirable to provide programmable logic device integrated circuits with internal power supply noise monitoring capabilities.

SUMMARY

In accordance with embodiments of the present invention, power supply noise measurements are made internally in a programmable logic device. With this arrangement, there is no need to measure noise on the power supply voltages external to the programmable logic device, which avoids packaging and circuit board influences.

Noise measurements may be made during testing or during normal device operation. A programmable logic device to be measured may be mounted on a circuit board or may be connected to a tester mount or other suitable mounting structure. In a typical arrangement, at least one of the input-output pins of the programmable logic device is left unconnected to external circuitry, thereby serving as a dummy pin.

The input-output circuitry on the programmable logic device contains output buffers and associated input buffers. An output buffer is provided with a logic input that directs the output buffer to provide a corresponding power supply voltage at its output. The output of the output buffer is connected to the dummy pin, which is unaffected by external influences.

A differential input buffer is located adjacent to the output buffer. The differential input buffer has two inputs. One input is connected to the output of the output buffer. Another input is connected to the circuit board (or other mounting structure) through an input-output pin. This input-output pin is supplied with a reference voltage from a voltage reference circuit. The voltage reference circuit may be built into external equipment such as an integrated circuit tester or may be mounted on the same circuit board as the programmable logic device.

The differential input buffer acts as a comparator and compares the power supply voltage from the output buffer to the reference voltage. A differential input buffer output signal is generated in response to this comparison. The output signal is processed by noise monitoring circuitry. With one suitable arrangement, the noise monitoring circuitry is implemented by configuring the programmable logic device to connect the output of the input buffer to a clock input of a register. The register also has a data input to which a logic signal is provided and has a register output. When the input buffer detects noise on the power supply voltage, the output of the input buffer changes state. This transition serves as a clock pulse for the register. The clock pulse clocks the register and causes the register to provide the logic signal from the data input to the register output. The register output can be used as test data or can be used to control internal or external circuitry.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
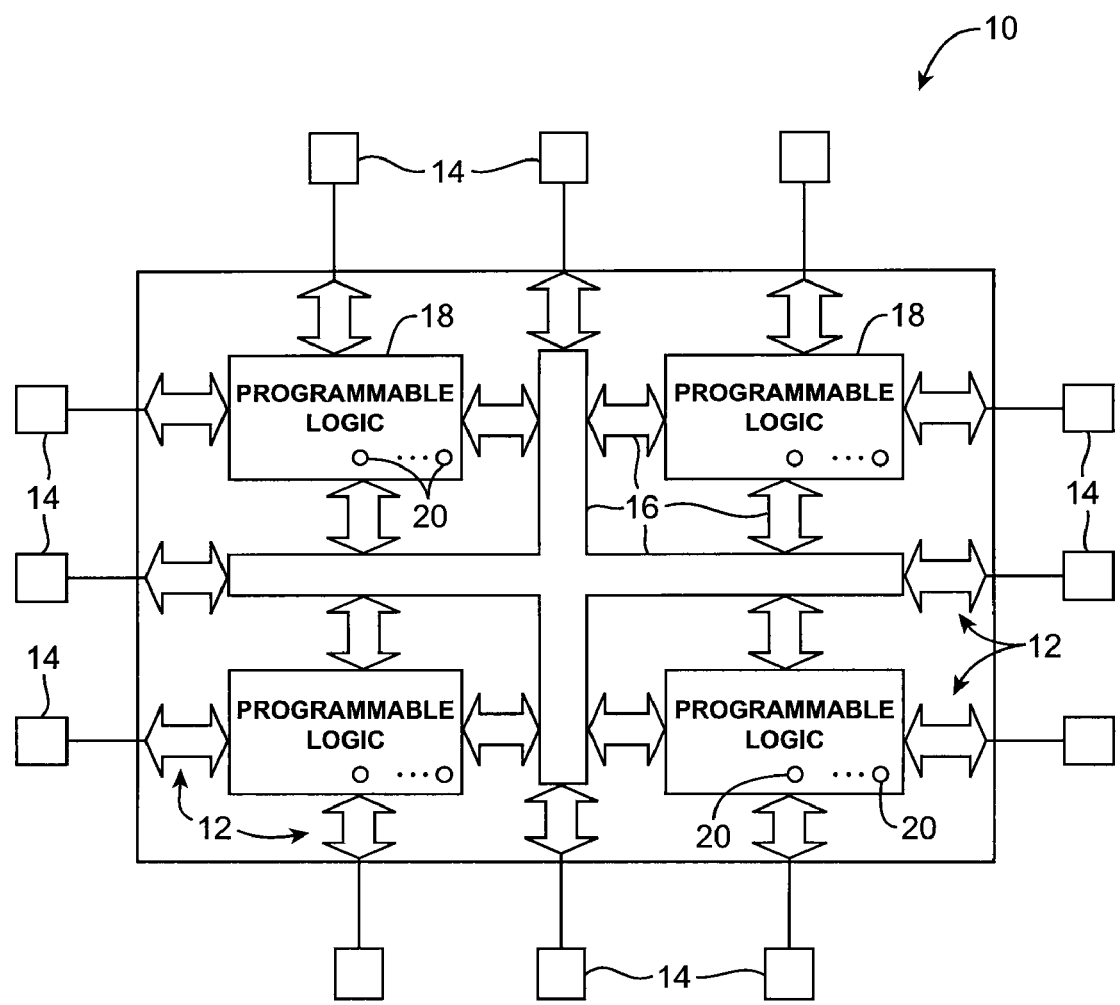
FIG. 1 is a diagram of an illustrative programmable logic device in accordance with the present invention.

The present invention relates to power supply noise measurement circuitry for programmable integrated circuits such as programmable logic device integrated circuits. The invention also relates to methods for using the noise measurement circuitry to make noise measurements to support testing and control operations.

Programmable logic devices are integrated circuits that can be configured by a user to perform custom logic functions. Programmable logic devices are configured ("programmed") by loading configuration data into the device. The configuration data selectively turns on and off components of the device's circuitry and thereby customizes the logic on the device. Programmable logic devices with non-volatile configuration memory retain their configuration data when power is removed. Programmable logic devices with volatile configuration data are typically loaded with configuration data on system power-up using an ancillary circuit called a configuration device. The configuration device may store the configuration data using non-volatile memory. Programmable logic devices with non-volatile memory can also be configured after installation in a system (so-called in-system programming).

The present invention may be used in the context of any integrated circuit that has circuitry that can be configured by a user to perform a custom function, but is described in the context of programmable logic devices for clarity.

If the noise on a signal path in a programmable logic device is too high, the data on that path may be corrupted. Noise effects must therefore be taken into account when designing programmable logic devices. Power supply noise is typically induced by logic switching, particularly when a large number of circuits on a device switch simultaneously.

Power supply noise induced by logic switching may pull down the positive power supply voltage (so-called Vcc sag) or may cause the ground voltage to rise above its nominal value (so-called ground bounce). In a typical scenario, both positive power supply noise and ground power supply noise are present at the same time. Because power supply busses tend to distribute power supply signals widely throughout a chip, power supply noise issues affect many different components and must be adequately addressed to ensure optimum circuit performance.

In accordance with the present invention, programmable logic device circuitry may be used to perform power supply noise measurements. If desired, noise measurements may be made using dedicated noise monitoring circuitry. Alternatively, or in conjunction with dedicated noise monitoring circuitry, commonly-available programmable logic device resources can be configured to implement the power supply noise monitoring circuitry. An advantage of using resources that are not dedicated to noise monitoring is that the invention can be used with existing programmable integrated circuit architectures. Configuring programmable logic device resources to implement a power supply noise monitoring circuit also makes it possible to include noise monitoring capabilities in a programmable logic device integrated circuit without requiring the addition of extra hardwired noise monitoring circuits.

In general, the invention can use dedicated (hardwired) noise monitoring circuits, noise monitoring circuits constructed by programming the non-dedicated resources of a programmable logic device integrated circuit, or noise monitoring circuits constructed using both hardwired and programmable resources. The invention will be described in the context of using non-dedicated programmable resources as an example.

The power supply noise monitoring circuitry can be used to characterize the internal power supply noise of the programmable logic device during testing. The power supply noise monitoring circuitry can also be used to produce noise-measurement-based control signals for optimizing system performance. If desired, the same power supply noise monitoring circuitry can be used both during testing and during normal operation. Alternatively, a programmable logic device may be configured to implement the noise monitoring circuitry only during testing.

An illustrative programmable logic device 10 of the type that may be configured so that its circuitry can be used to perform power supply noise measurements is shown in FIG. 1.

Programmable logic device 10 may have input-output circuitry 12 for driving signals off of device 10 and for receiving signals from other devices via input-output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device 10 is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements in the programmable logic device 10 using pins 14 and input/output circuitry 12. During normal operation of device 10, the programmable elements (also sometimes called configuration bits or configuration memory) each provide a static control output signal that controls the state of an associated logic component in the programmable logic of circuitry 18.

In a typical volatile memory arrangement, the programmable elements may be random-access memory (RAM) cells that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The programmable circuitry that is configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured antifuses, programmable logic devices in which elements 20 are formed from electrically-programmable read-only-memory (EPROM) or erasable-electrically-programmable read-only-memory (EEPROM) technology, programmable logic devices with programmable elements made from magnetic storage elements, programmable logic devices with programmable elements made from phase-change materials, mask-programmed devices, etc. Illustrative programmable logic elements are shown schematically as elements 20 in FIG. 1.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired wireless circuitry may be used to receive wirelessly-transmitted configuration data. Other hardwired communications circuitry and digital signal processing circuitry (e.g., multipliers, adders, etc.) may also be used.

Figure 2:
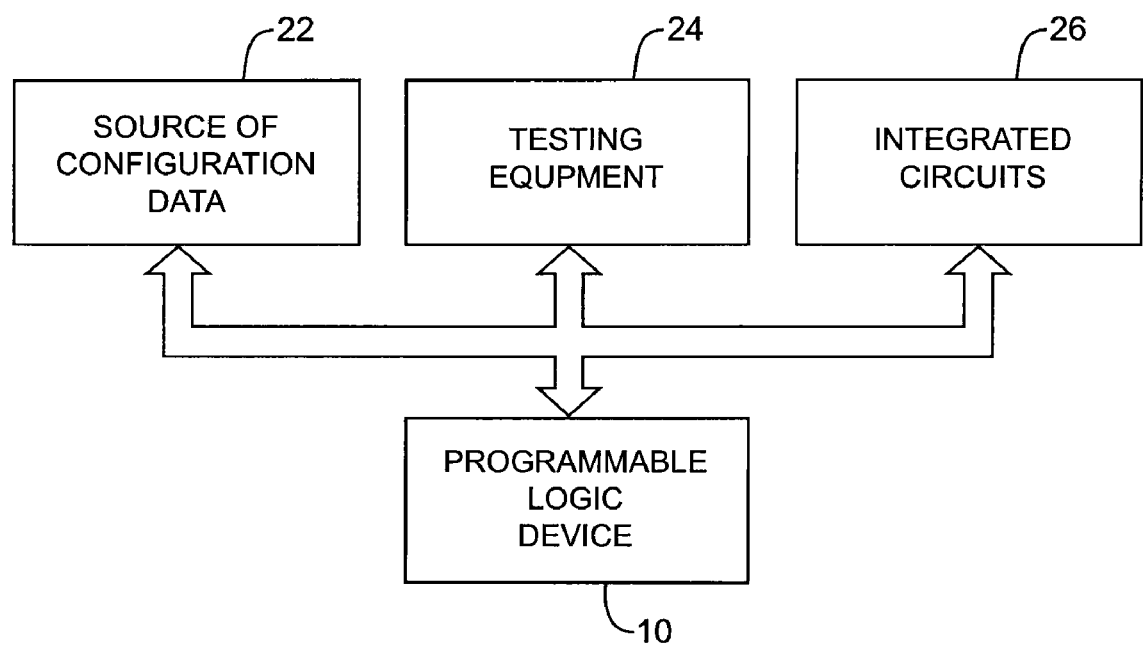
FIG. 2 is a diagram showing how a programmable logic device integrated circuit interacts with a source of configuration data, testing equipment, and other integrated circuits in accordance with the present invention.

Illustrative components with which programmable logic device 10 interact are shown in FIG. 2. As shown in FIG. 2, a programmable logic device 10 receives programming data from a data source 22. In a typical scenario, device 10 is mounted on a printed circuit board in a system. In general, programmable logic device 10 may receive programming data from any suitable equipment or device. During testing, for example, programmable logic device 10 may receive configuration data from testing equipment 24. During testing and during normal operation, the programmable logic device integrated circuit 10 may communicate with other integrated circuits 26 (e.g., circuits that communicate with programmable logic device 10 over single-ended or differential communications paths).

If desired, programmable logic device 10 may be the type of programmable logic device that receives configuration data from one or more associated memory and loading chips. The integrated circuits that are used to load configuration data into a programmable logic device are sometimes called a "configuration device". With this type of arrangement, a memory chip and separate loading chip or an integrated memory and loading chip may, if desired, be mounted on the same board as programmable logic device 10. The configuration device (which serves as source 22) may, for example, include erasable-programmable read-only memory (EPROM) circuitry for storing configuration data and programmable logic device configuration data loading circuitry for loading the data into device 10. When the system boots up (or at another suitable time), the configuration data for configuring the programmable logic device may be supplied to programmable logic device from the configuration device. Device 10 may also be configured by loading test configuration data into device 10 from a source such as testing equipment 24 or by loading configuration data from a source such as a device "programmer."

Devices 10 are generally programmed by different entities at different times. During testing, for example, devices 10 may be programmed with test configuration data. If a defect is detected during testing, a manufacturer may repair the defect by programming a device to switch redundant circuitry into use. After a device has been shipped to a customer, the customer programs the device to implement a custom logic function before installing the programmed device into a system and shipping it to an end user.

The programming operations of the present invention may be performed by any suitable user (e.g., a tester using a source of configuration data in a tester, a manufacturer using a source of configuration data in a programmer, a customer using a source of configuration data in a programmer, a user loading programming data from a configuration device, etc.).

Figure 3:
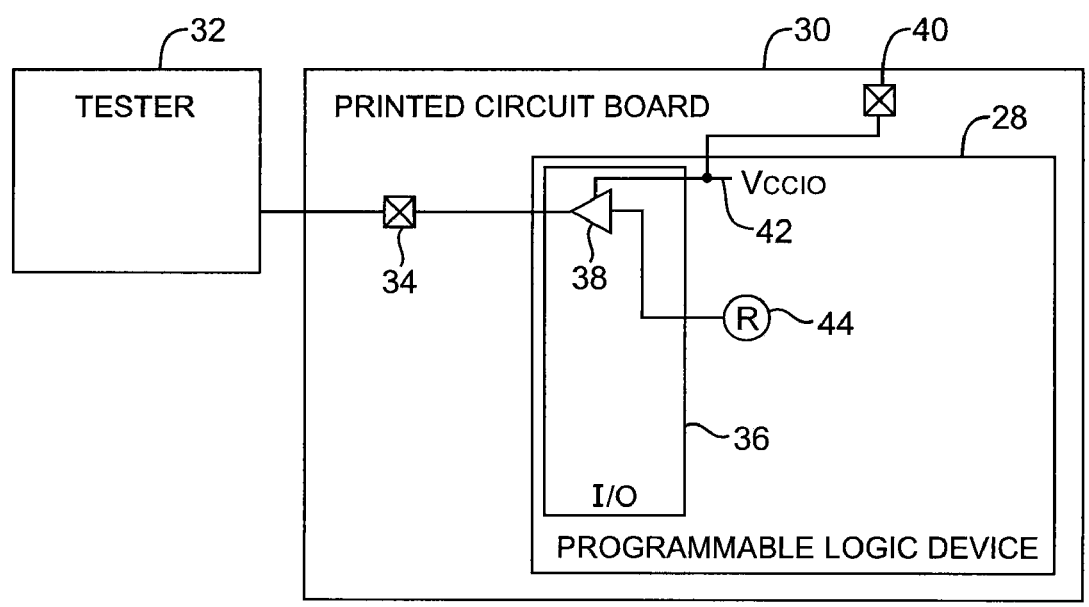
FIG. 3 is a diagram of a conventional arrangement for measuring power supply noise for a programmable logic device integrated circuit.

A conventional arrangement for making noise measurements on the power supply voltages in a programmable logic device is shown in FIG. 3. As shown in FIG. 3, a test programmable logic device 28 is mounted on a printed circuit board 30. The programmable logic device 28 contains input-output (I/O) circuitry 36. The I/O circuitry 36 contains an output buffer 38. Signals from the output of output buffer 38 are provided at I/O pin 34 of the programmable logic device 28. A tester 32 is connected to the printed circuit board 30 and monitors the signals provided on pin 34.

The programmable logic device 28 is powered from a power supply voltage on the printed circuit board. The programmable logic device 28 receives power though power supply pins such as a ground pin and positive power supply pin 40. Internal power supply busses such as positive power supply bus 42 are used to convey power to internal components in the programmable logic device. In order to monitor the state of the power supply signal on bus 42, a programmable logic element 44 is configured to drive a logic "1" into output buffer 38, while output buffer 38 is turned on and powered with the positive power supply signal $V_{CCIO}$ on bus 42. This causes the positive power supply voltage $V_{CCIO}$ to be driven onto pin 34, where it is measured by tester 32. The ground power supply can also be provided on a suitable I/O pin.

Tester 32 can use this type of arrangement to attempt to determine the noise present on the internal positive power supply and internal ground power supply busses of the programmable logic device 28. However, substantial inaccuracies are introduced by driving the power supply signals through the package of programmable logic device 28 and the circuit board environment created by mounting device 28 on a printed circuit board 30. The approach of FIG. 3 may also require use of special test circuit boards.

With the present invention, the programmable resources of the programmable logic device 10 are used to support internal power supply noise measurements. This approach improves accuracy, because influences from the packaging and circuit board mounting environment are reduced or eliminated. The power supply noise measurements can be used for testing and for controlling programmable logic device 10 and other devices during operation in a system.

The invention can be used to test programmable logic devices that have been mounted using any suitable arrangement. For example, the invention can be used to test programmable logic devices that have been mounted in a tester (e.g., in a test mount) or devices that have been mounted on a printed circuit board.

Figure 4:
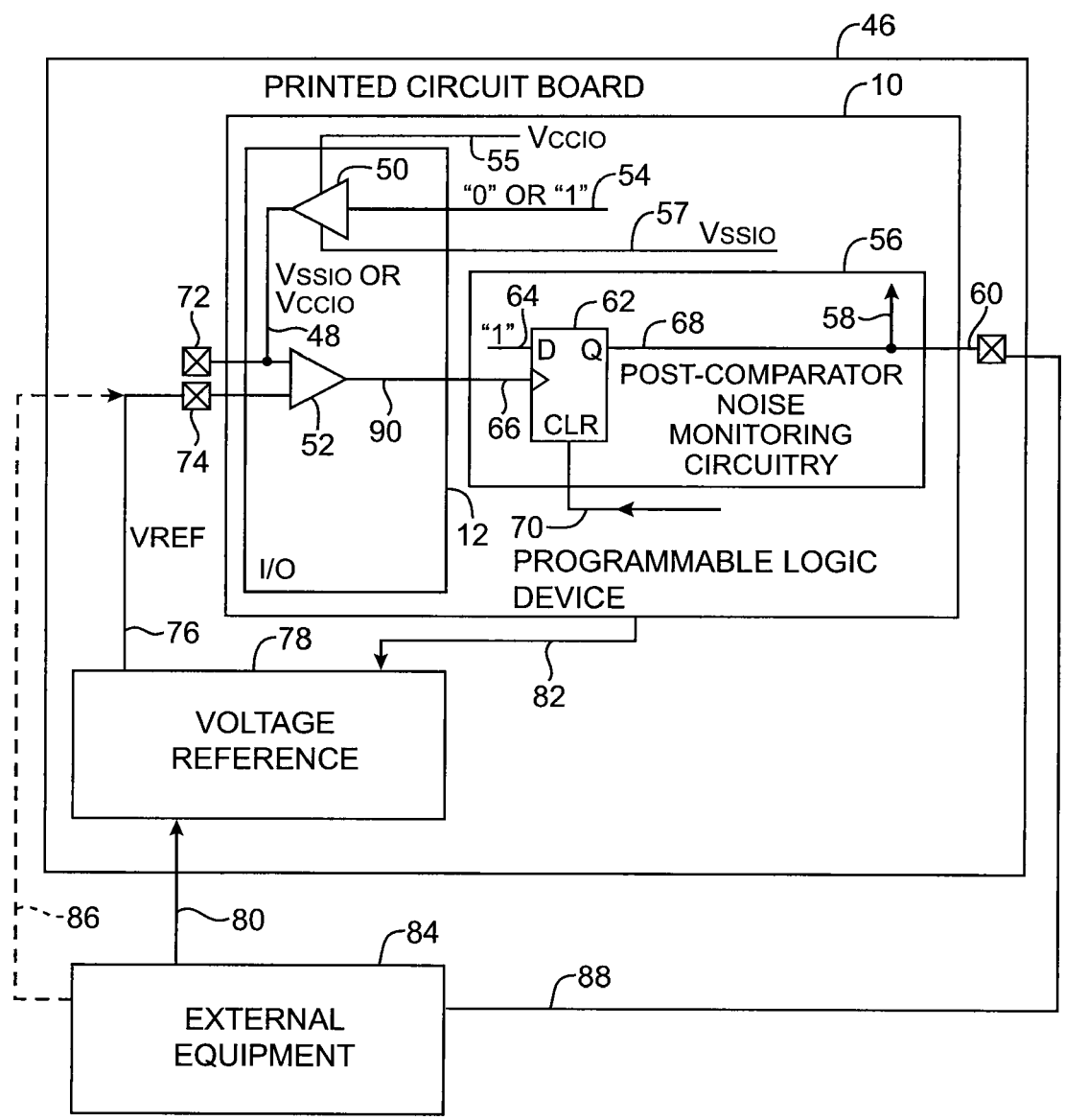
FIG. 4 is a diagram of an illustrative programmable logic device integrated circuit having power noise monitoring circuitry in accordance with the present invention.

A typical system environment in which power supply noise measurements can be made is shown in FIG. 4. In the example of FIG. 4, programmable logic device 10 has been mounted on a printed circuit board 46 that is attached to external equipment 84. The external equipment may include equipment such as a digital oscilloscope and an associated computer for capturing test measurement signals from device 10 via paths such as path 88 and for controlling voltage reference 78 via path 80 or for supplying a reference voltage via path 86.

Programmable logic device 10 contains programmable circuitry as described in connection with FIG. 1. In a typical device architecture, some of the circuitry of device 10 is so-called "core logic" which generally occupies the center of device 10 and operates at a relatively low core-logic power supply voltage (called Vcccore). Typical values of Vcccore for modern device designs are 2.5 volts, 1.8 volts, 1.5 volts, and 1.2 volts. The ground voltage used in the logic core is referred to as Vsscore (e.g., 0 volts). It is expected that as process technology advances, it will be possible to reduce the core power supply voltage even further.

The low power supply voltage used for the core logic is desirable, because it reduces power consumption. However, it is often desirable to use elevated power supply voltages for peripheral circuitry such as I/O circuitry 12. Using larger voltages for the I/O circuitry helps to reduce noise when transmitting signals between integrated circuits and ensures compatibility when communicating with circuits that require larger I/O voltages. The positive power supply voltage level used in the I/O circuitry 12 is referred to as Vccio. The ground voltage in the I/O circuitry 12 (e.g., 0 volts) is referred to as Vssio.

If desired, programmable logic device 10 can have other power supply voltages (e.g., an intermediate power supply level that is smaller than Vccio and larger than Vcccore). For clarity, however, the present invention is generally described in the context of measuring noise on power supply voltages such as Vccio (and Vssio) and Vcccore (and Vsscore).

In the arrangement of FIG. 4, device 10 has internal power supply buses 55 and 57. Busses 55 and 57 are used to distribute the respective power supply voltages Vccio and Vssio to the components in the device 10. Typically an external (board-level) source of Vccio and Vssio are connected to these internal busses through one or more power supply pins. It is not possible, however, to accurately measure the noise on the internal power supply busses by monitoring the voltages at these power supply pins due to capacitive loading effects.

Accurate measurements are made by configuring the circuitry of I/O circuitry 12 to drive the power supply voltages Vssio and Vccio to an I/O pin 72. The pin 72 is preferably not connected to any active circuitry on board 46, which reduces capacitive loading effects and isolates the pin from the circuits on the board. Because pin 72 is not connected to other integrated circuits, pin 72 is sometimes referred to herein as a "dummy" pin.

Depending on the type of programmable logic device 10 whose power supply lines are being measured, the I/O circuitry 12 may contain different types of input and output resources. In the example of FIG. 4, I/O circuitry 12 includes a single-ended output buffer 50 and a differential input buffer 52. Single-ended buffers handle single-ended signals, which are signals that are reference to ground. Differential buffers have a pair of differential inputs. In differential mode, the signals on the differential inputs are referenced to each other. Differential I/O arrangements are sometimes preferred for high-speed communications because they tend to exhibit higher bandwidths and greater noise immunity than single-ended buffers.

To measure noise on the power supplies Vssio and Vccio, two single-ended output buffers 50 in I/O circuitry 12 are configured to supply these voltages at their outputs. Only a single output buffer 50 and input buffer 52 are shown in FIG. 4 to avoid over-complicating the drawings.

In a typical arrangement, a Vssio signal is provided at the output of one output buffer 50 by configuring device 10 to supply a logic low to the input of that buffer, while a Vccio signal is provided at the output of another output buffer 50 by configuring device 10 to supply a logic high at the input of that buffer. In the diagram of FIG. 4, the low and high logic drive signals on the inputs to these two buffers 50 are represented by the notation "0" or "1" adjacent to buffer input line 54.

Each buffer 50 provides the power supply signal (Vssio or Vccio) to I/O pin 72 (i.e., a dummy pin) via a line 48. The line 48 carrying the Vssio signal is connected to one of the pair of inputs of one of the differential input buffers 52. The other input to this differential input buffer 52 receives a ground voltage reference signal provided at its I/O pin 74. The line 48 carrying the Vccio signal is connected to one of the inputs of the other differential input buffer 52. The other input to this differential input buffer 52 receives a positive power supply voltage reference signal provided at its I/O pin 74.

Each input buffer 52 compares its power supply voltage input to its reference voltage input and generates a corresponding output depending on which of these voltages is greater than the other.

The reference voltage may be supplied to pin 74 using any suitable arrangement. The reference voltage may be fixed or may be variable. When a variable reference voltage arrangement is used, the reference voltage may be swept through a range of voltages to make voltage-sensitive power-supply noise measurements. Fixed voltage references may be advantageous when it is desirable to reduce cost and complexity in the monitoring arrangement.

With one suitable approach, the reference voltage is supplied from an external voltage reference 78. The external voltage reference 78 may be, for example, a digitally-controlled voltage regulator mounted on board 46. The voltage reference 78 may be controlled by a computer or other suitable external equipment 84 via control path 80. The reference voltage output of voltage reference 78 may be applied to pin 74 via a trace 76 on board 46 that is connected between reference 78 and pin 74.

Figure 5:
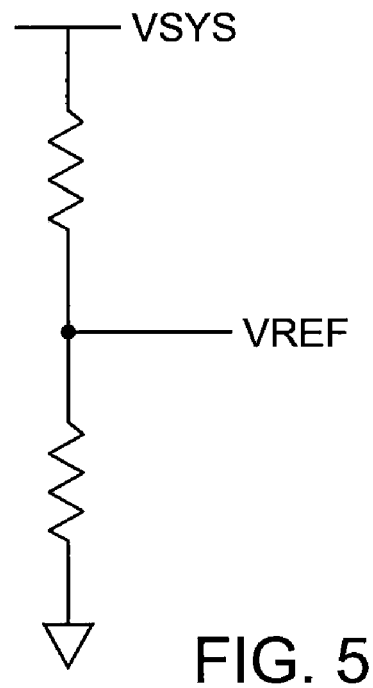
FIG. 5 is a diagram of an illustrative fixed voltage reference circuit in accordance with the present invention.
Figure 6:
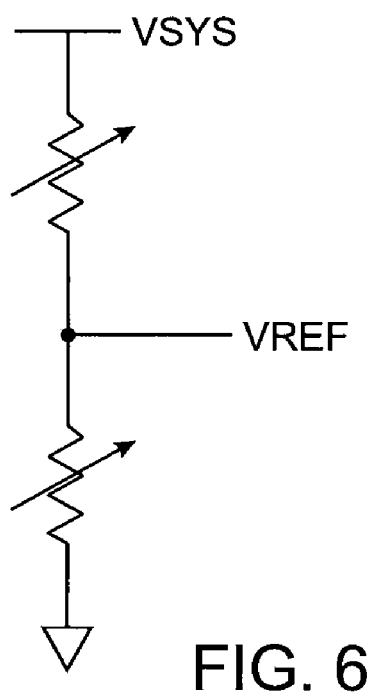
FIG. 6 is a diagram of an illustrative controllable voltage reference circuit in accordance with the present invention.

An illustrative voltage reference 78 based on a voltage divider circuit having two fixed resistors is shown in FIG. 5. An adjustable voltage reference 78 based on a voltage divider circuit having two adjustable resistors is shown in FIG. 6. An advantage of using an adjustable voltage reference 78 (based on adjustable resistors or based on a more complex voltage regulator circuit) is that this type of arrangement allows the reference voltage at output 76 to be swept through a range of voltages to make more comprehensive noise measurements. The adjustable resistors in the voltage reference circuit may be controlled in real time by control signals from external equipment 84.

If desired, the external equipment 84 may include a voltage source. In this type of arrangement, the external equipment may generate the reference voltage and may apply the generated reference voltage to pin 74 directly through path 86 (e.g., though a probe tip or other suitable connection between equipment 84 and pin 74).

The reference voltage provided at pin 74 is selected to be close to the nominal power supply level on line 48. For example, when measuring noise on a ground signal Vssio having a nominal voltage level of 0 volts, the reference voltage (VREF) may be set to 0.1 volts (as an example). When measuring noise on a 2.4 volt positive power supply, VREF may be set to 2.3 volts (as an example).

Differential input buffer 52 serves as a comparator that compares the power supply signal provided one of its inputs (via line 48 located at the dummy pin 72) to the reference voltage provided to its other input (via pin 74). If there is noise present on the power supply line, the output of the input buffer 52 will change its state. Otherwise, the output of input buffer 52 will remain constant.

The initial and final state of the input buffer's output depend on whether the input buffer is being used in a circuit that detects negative-going transients on the positive power supply voltage line that drop below the reference VREF (Vcc sag) or is being used in a circuit that detects positive-going transients on the ground power supply that rise above the reference VREF (ground bounce). As an example, the output of buffer 52 may be high unless the value of Vccio on input 72 drops below VREF. If Vccio drops below VREF (in this example), the output of buffer 52 will transition from high to low. In the corresponding Vss bounce circuit, the output of buffer 52 may be low unless Vssio rises above VREF, in which case the buffer output goes high. To make the polarities of these two circuits match so that the same type of downstream noise monitoring scheme can be used, an inverter may be connected to the output of the Vcc sag circuit.

In a typical programmable logic device 10 using the present invention, one differential input buffer 52 is configured to measure Vcc sag on a Vccio line and another differential input buffer 52 is configured to measure Vss bounce on a Vssio line. With this type of arrangement, both circuits are used at the same time to gather Vccio and Vssio noise readings. Alternatively, a single noise circuit of the type shown in FIG. 4 may be used to measure both Vccio noise and Vssio noise in consecutive time-multiplexed readings. Using a time-multiplexed scheme conserves I/O pins and circuit resources. Using two parallel noise measurements circuits consumes more resources, but may make more accurate measurements possible under certain noise conditions.

The output signal that is produced on line 90 at the output of differential input buffer 52 in the presence of power supply noise is provided to post-comparator noise monitoring circuitry 56 for processing. In general, noise monitoring circuitry 56 may be based on any suitable noise monitoring arrangement. For example, noise monitoring circuitry 56 may include memory and processing circuitry (e.g., counting circuitry) for processing output data on line 90 to characterize noise on line 54.

In the example of FIG. 4, noise monitoring circuitry 56 includes a register (DQ flip-flop) 62. Register 62 may be an I/O register that is contained within I/O circuitry 12 or may be a register from another location in programmable logic device 10 such as the logic core. Register 62 has a data input 64 and a clock input 66. The data input is electrically coupled to source of a logic high (i.e., a logic "1"). The logic high may be provided by configuring programmable circuitry in device 10 to route a logic "1" to the input 64. The clock input 66 is electrically coupled to line 90 and receives the output signal from differential input buffer 52.

Register 62 has a clear input that receives a clear signal from line 70 to clear its contents. Noise measurements are made after register 62 has been cleared. Register 62 provides an output signal on output line 68. After the register has been cleared, the output on line 68 is a logic low ("0"). If no significant power supply noise is present, the power supply signal at input of input buffer 52 will not vary significantly from its nominal value. As a result, the output of input buffer 90 will remain constant and the output of register 62 will remain low. If, however, there is significant power supply noise on line 54, the power supply voltage at the dummy pin input to input buffer 52 will vary relative to the reference voltage being supplied to the reference voltage input to input buffer 52. This will cause the output signal on line 90 to change its logic state (e.g., from low to high). Line 90 is connected to the clock input 66 of register 62 (either directly or through an inverter to correct its polarity), so when the signal on line 90 changes state, the clock input 66 goes high and the register 62 is clocked by one cycle. In response to this clock pulse, the logic one at input 64 passes to the Q output 68 of the register.

The value of Q may be provided to circuitry on device 10 for processing via internal line 58 or may be provided to external equipment 84 for processing via programmable logic device output pin 60 and path 88. The value of Q forms a type of power supply noise measurement data and may be processed using any suitable technique. With one suitable approach, the register 62 is cleared according to a predetermined time interval. The presence of a Q transition from 0 to 1 within the predetermined time interval can be used as an indicator of the level of power supply noise. As another example, after clearing register 62, the output of register 62 may be monitored continually. If the register output goes high, a flag may be set on device 10. Software in the system can use the value of the flag to generate an appropriate warning or to take corrective action (e.g., by making circuit adjustments).

Figure 7:
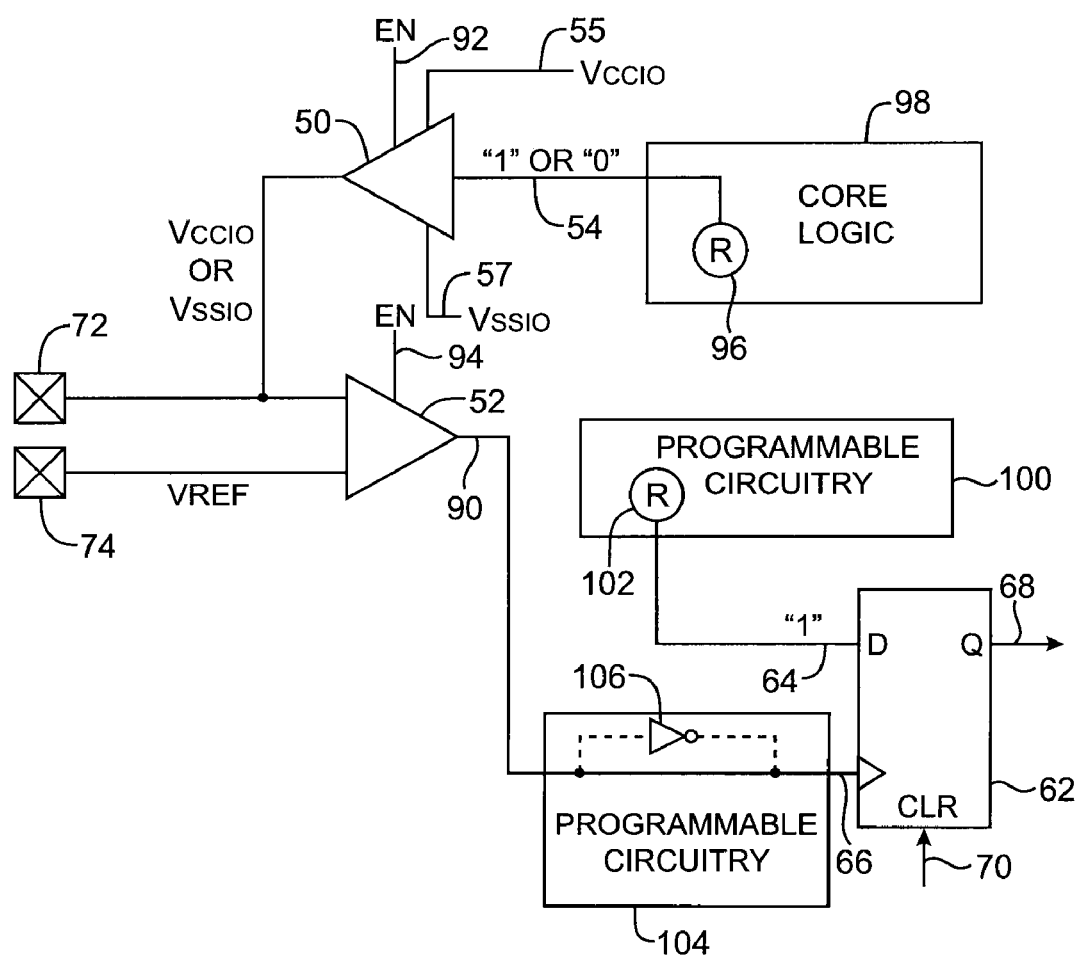
FIG. 7 is a diagram of an illustrative register-based power supply noise monitoring circuit in accordance with the present invention.

The diagram of FIG. 7 provides additional circuit details on an illustrative embodiment of the I/O circuitry 12 and noise monitoring circuitry 56 of FIG. 4. As shown in FIG. 7, the output buffer 50 and input buffer 52 may have respective enable control lines 92 and 94. Enable control line 92 is used to turn output buffer 50 on and off as needed. Enable control line 94 is used to control whether input buffer 52 is on or off (tri-stated). To configure the circuitry of FIG. 7 to perform the power supply noise measurement operations of the present invention, both enable lines 92 and 94 are taken high, which turns on output buffer 50 and input buffer 52.

The "1" or "0" logic control inputs that are provided to output buffer 50 via line 54 are generated by a programmable element 96, which is typically located in core logic 98. Core logic 98 is part of the programmable logic device logic core running at the reduced power supply voltage Vcccore and Vsscore. Power is supplied to output buffer 50 using Vccio bus 55 and Vssio bus 57. When the input on line 54 is high, the output of buffer 50 is tied to Vccio. When the input on line 54 is low, the output of buffer 50 is taken to Vssio.

The Vccio or Vssio signal on the output of buffer 50 is provided to the dummy pin input 72 of differential input buffer 52. The voltage reference VREF is provided to the other input of buffer 52. The buffer 52 provides a corresponding output signal at output 90. Programmable circuitry 104 is configured to convey the output signal from output 90 to input 66 of register 62. To ensure that the signal received at register 62 has the proper polarity, the output from buffer 52 can be inverted by configuring the programmable circuitry 104 to include an inverter 106 (an odd number of inverters) in the path between buffer 90 and input 66.

Programmable circuitry 100 contains a programmable element 102 that is configured to provide a logic "1" to the data input 64 of register 62. Programmable circuitry 100 and 104 may be core logic and/or input-output circuitry that is configured by loading appropriate configuration data during device programming. Register 62 may be implemented using core logic or input-output logic.

When there is noise on the power supply, the output 90 of buffer 52 changes state, which causes register 62 to receive a clock pulse on clock input 66. When the clock input is pulsed in this way, the data ("1") on input 64 is passed to the output 68. Output 68 is indicative of the presence of power supply noise and can be used internally or externally.

Figure 8:
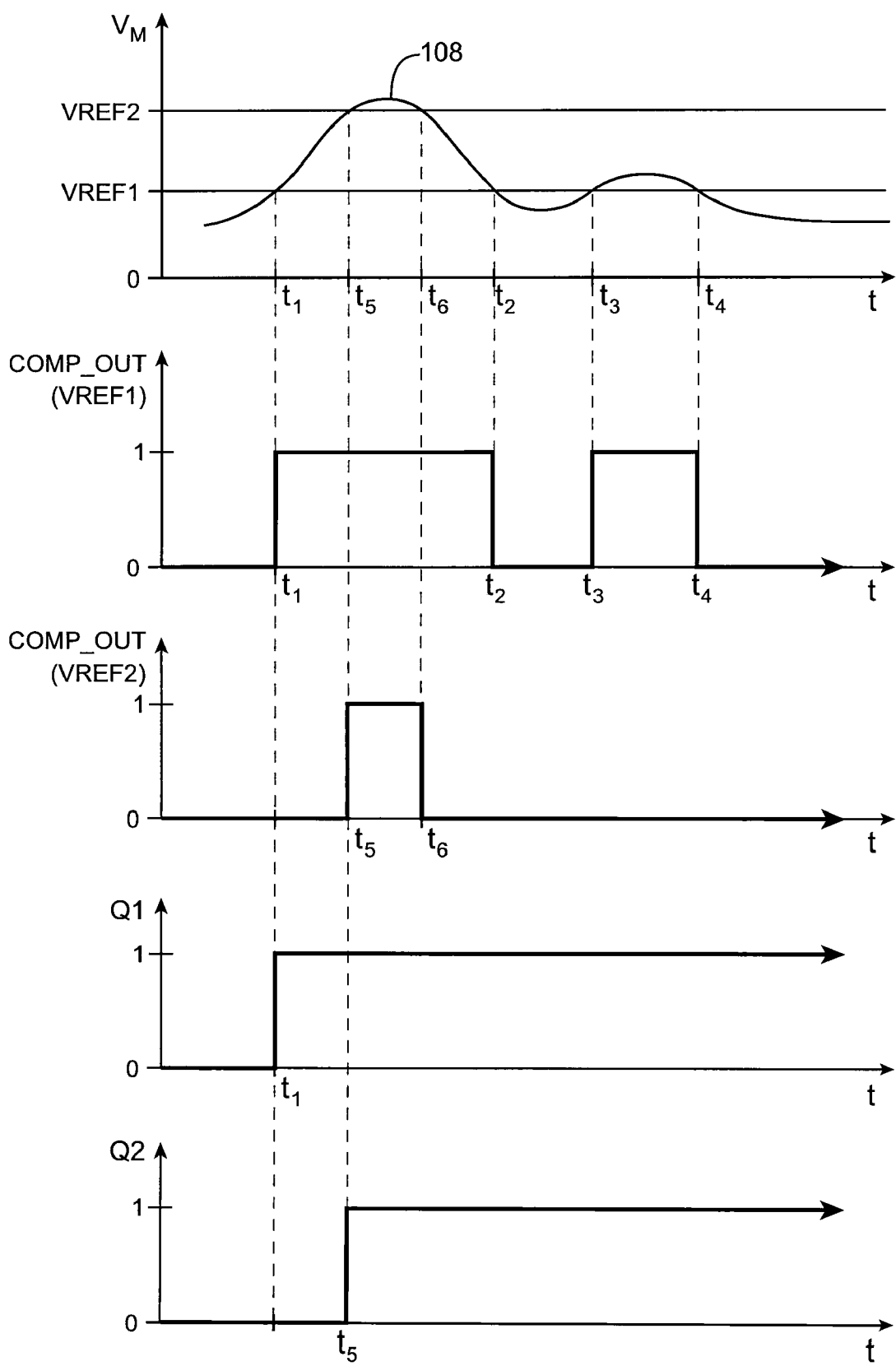
FIG. 8 is a graph showing how the noise monitoring circuit of FIG. 7 processes monitored power supply voltages in accordance with the present invention.

The graphs of FIG. 8 show how the circuit of FIG. 7 operates to detect noise. In the example of FIG. 8, the ground power supply Vssio is being monitored. In the upper trace of FIG. 8, the measured Vssio signal $V_M$ is plotted as a function of time as curve 108. Two different noise detection scenarios are depicted in FIG. 8. In the first scenario, the voltage reference VREF has been set to a relatively low level of VREF1. In the second scenario, the voltage reference VREF has been set to a higher level of VREF2.

Assume that VREF is set to VREF1. At time $t_1$, the voltage $V_M$ rises above VREF1. When the voltage VREF at the input the input buffer 52 is set to VREF1 and the voltage $V_M$ rises above VREF1, the output of buffer 90 goes high, as indicated by the output COMP_OUT (VREF1) in the second trace of FIG. 8. So long as the voltage $V_M$ stays above VREF1, the COMP_OUT signal remains at a logic 1. In the example of FIG. 8, the signal $V_M$ falls below VREF1 at time $t_2$, which cases the COMP_OUT signal to fall at time $t_2$. Another noise event occurs between time $t_3$ and $t_4$, causing a second COMP_OUT (VREF1) pulse. The transition of the COMP_OUT (VREF1) signal from low to high at time $t_1$ clocks register 62 and cause the output Q1 of register 62 on line 68 to go high (and remain high until cleared), as shown in the fourth trace of FIG. 8 (labeled Q1).

If VREF is set to VREF2, only one noise event is detected under the conditions of FIG. 8. As shown by curve 108, the voltage $V_M$ rises above VREF2 at time $t_5$ and remains above VREF2 until time $t_6$. As a result, the output of input buffer 52 goes high at time $t_5$, as shown by the third trace of FIG. 8, labeled COMP_OUT (VREF2). The transition of the output of input buffer 52 from low to high at time $t_5$ causes the output of register 62 Q2 to transition from low to high (and to remain high until cleared), as shown by the fifth trace of FIG. 8.

As this example demonstrates, changing the VREF setting affects the time at which the output of register 62 goes high. If the VREF setting is very close to the nominal value of Vssio (e.g., VREF is set to 0.05 volts when Vssio is at 0 volts), the output of register 62 might go high almost immediately in the presence of small amount of noise. If, however, the VREF setting is far from the nominal value of Vssio (e.g., VREF is set to 0.2 volts when Vssio is 0 volts), the output of register 62 might never go high. The VREF setting therefore serves as a sensitivity setting that may be used to customize the performance of the power supply noise measurement circuitry for a particular application. If desired, the voltage reference VREF may be adjusted in real time (e.g., to sweep through a range of voltages such as VREF1, VREF2, and other voltages), thereby providing a more comprehensive characterization of the power supply noise level.

Figure 9:
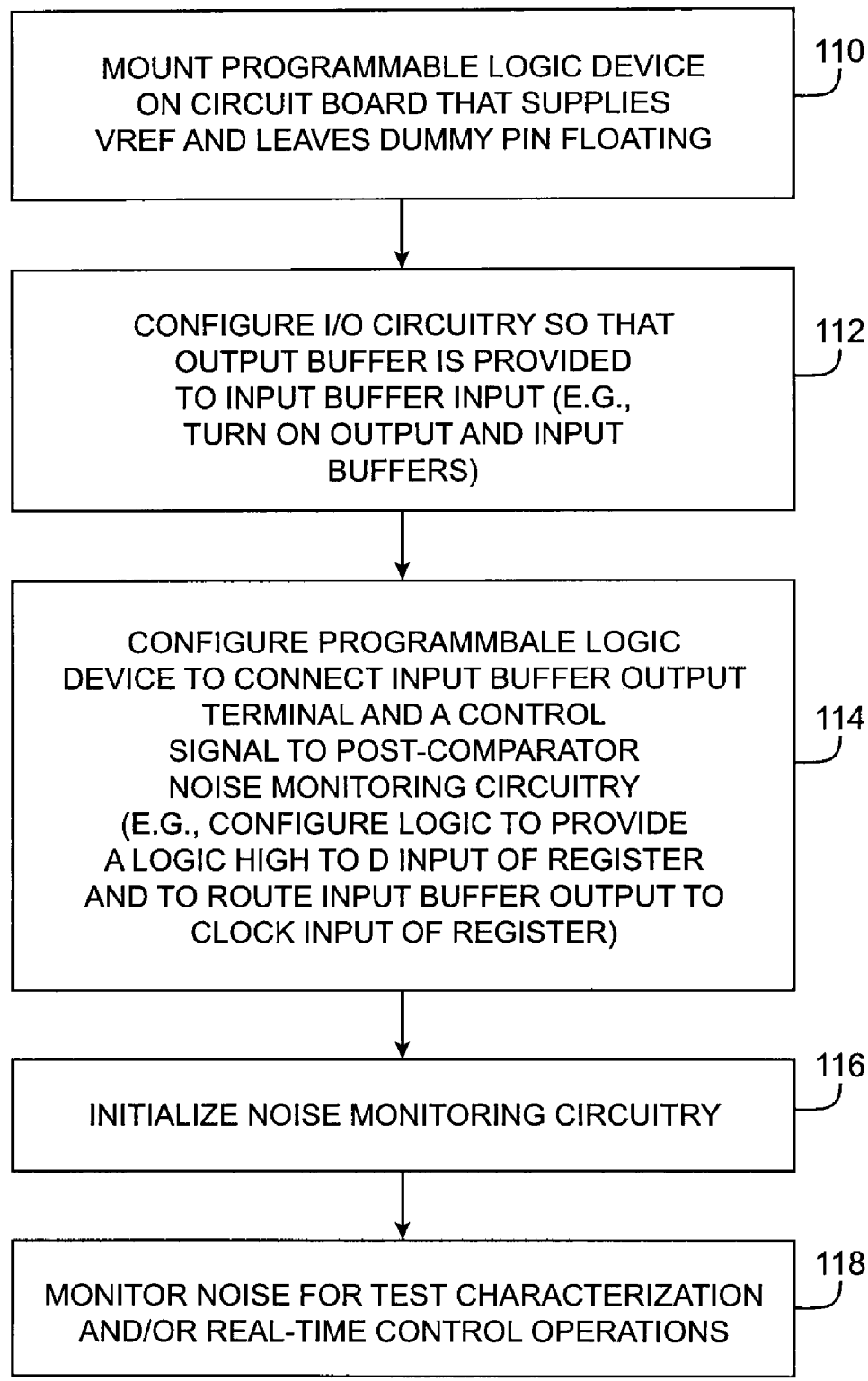
FIG. 9 is a flow chart of illustrative steps involved in power supply noise measurement operations in accordance with the present invention.

Illustrative steps involved in using programmable logic device circuitry to make power supply noise measurements in accordance with the present invention are shown in FIG. 9. At step 110, a programmable logic device 10 is mounted on a circuit board 46. The circuit board has conductive power supply paths that are used to supply power supply voltages to the programmable logic device. The circuit board also has a conductive path for providing the voltage VREF to pin 74 (FIG. 4). The circuit board layout is designed so that no active circuitry is connected to dummy pin 72 (i.e., pin 72 floats). If desired, programmable logic device 10 can be mounted in a temporary (testing) board and/or test mount, rather than a normal system circuit board.

At step 112, the input-output circuitry 12 of programmable logic device 10 is configured so that the output line from an output buffer 50 is electrically coupled to one of the inputs of a differential input buffer 52. Programmable logic devices 10 typically have output buffers and input buffers of different types. To route a power supply signal to an appropriate differential input in an input buffer, the input of a single-ended output buffer can be provided with an appropriate logic high or logic low signal. This connects the output of the single-ended output buffer to either Vccio or Vssio. The power supply signal (Vccio or Vssio) on the output of the output buffer is received by the differential input of a differential input buffer that is associated with the output buffer (e.g., an adjacent differential input buffer). The enable lines of the output buffer and input buffer are used to turn both of the buffers on, which ensures that the power supply signal from the output buffer is provided to the input of the input buffer. The enable lines and drive signal for the output buffer are set by loading appropriate configuration data into the programmable logic device. The VREF signal is provided to the input buffer from the circuit board. The input buffer operates as a comparator and compares the power supply signal to VREF to produce a corresponding output.

The configuration data that is used to program the programmable logic device during step 112 so that its input-output circuitry is configured properly is also used to configure the post-comparator noise monitoring circuitry 56 (FIG. 4). This process, which is illustrated by step 114 in FIG. 9, involves configuring the noise monitoring circuitry 56 so that the output of the input buffer can be processed. If, for example, a register-based noise monitoring arrangement of the type described in connection with FIG. 7 is used, the programmable logic device can be configured so that a logic "1" is applied to an appropriate register 62 and so that the output of the input buffer is routed to the clock input of the register. If desired, an inverter 106 (FIG. 7) may be included in the path between the output of the input buffer and the clock input of the register to ensure that the polarity of the clock signal is correct.

Although illustrated as separate steps, the operations of steps 112 and 114 typically take place at the same time, as the programmable logic device 10 is loaded with configuration data from a tester or other suitable source of configuration data.

At step 116, following the device configuration operations of steps 112 and 114, the noise monitoring circuitry 56 is initialized. If, for example, the noise monitoring circuitry contains a register such as register 62 of FIG. 7, the register can be cleared by applying a clear signal to clear input 70. Other types of noise monitoring circuits may use different initialization techniques.

At step 118, the programmable logic device may be used to monitor power supply noise. The noise measurements are made internally, because the power supply output signal from the output of the output buffer is received directly by the input of the differential input buffer and is not processed externally. As a result, the power supply noise measurements are not influenced by the programmable logic device package and circuit board environment.

The information that is gathered on the level of power supply noise in the device 10 can be used externally or internally. The noise measurements can be used for test characterization or for real-time control (e.g., to improve the performance of the device 10).

If desired, the reference voltage VREF can be adjusted as power supply noise measurements are made. This allows the noise of the power supply voltages to be characterized more completely than if a fixed value of VREF is used. In general, any suitable technique may be used for making noise measurements at different values of VREF. Control signals for generating different VREF values may be produced by programmable logic device 10 and/or by external equipment 84 (FIG. 4).

Figure 10:
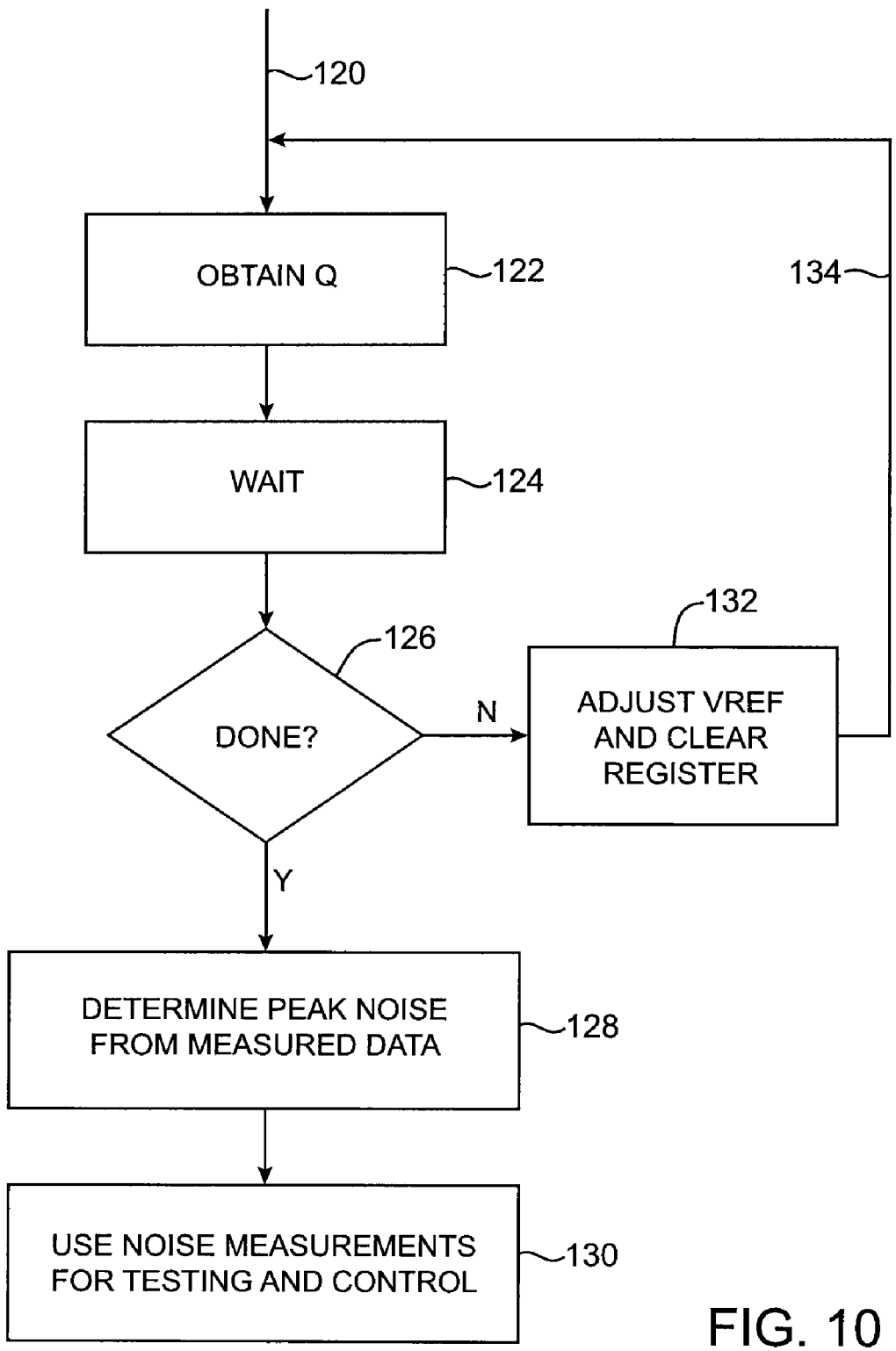
FIG. 10 is a flow chart of illustrative steps involved using a register-based power supply noise measurement circuit to make power supply noise measurements while making reference voltage adjustments in accordance with the present invention.

An illustrative measurement technique in which VREF is varied while making noise measurements using a noise measurement circuit of the type shown in FIGS. 4 and 7 is shown in FIG. 10. The operations of FIG. 10 correspond to step 118 of FIG. 9.

Before the operations of FIG. 10 take place, the noise monitoring circuitry is initialized (step 116 of FIG. 9). During initialization operations, the register 62 (FIGS. 4 and 7) is cleared. Processing then continues at step 122 of FIG. 10, as indicated by line 120.

At step 122, register 62 is used to obtain a value of Q. The Q value is obtained by using the output of the input buffer to clock the register while an appropriate signal is applied to data input 64.

At step 124, the monitoring circuitry 56 (FIG. 4) waits (e.g., for a wait time $t_w$). A default, user-selected, or variable value may be used for $t_w$. After the wait of step 124 is complete, processing proceeds to test 126. At test 126 it is determined whether noise measurements are complete. If the process of gathering noise measurement data (Qs) is complete, the noise measurements that have been gathered may be processed. For example, the gathered noise measurements may be processed to determine the peak noise and other noise characteristics at step 128. The noise measurements may be used for testing and/or control of the programmable logic device (step 130). The processing of step 128 may be performed using processing circuitry in programmable logic device 10 and/or external processors (e.g., in external equipment 84 of FIG. 4).

If test 126 is negative, the value of VREF is adjusted at step 132 and the noise monitoring circuitry 56 is reinitialized (e.g., the register 62 is cleared using an internal or external signal applied to line 70). Processing circuitry in programmable logic device 10 and/or the processing capabilities of external devices such as external equipment 84 of FIG. 4 may be used to control the adjustments to VREF. For example, external equipment such as a device tester can sweep VREF through a range of voltages using a set of small increments. Each time VREF is adjusted at step 132, the value of VREF is incremented (or decremented) by a predetermined amount. As shown by line 134, after the value of VREF has been adjusted at step 132, processing loops back to step 122, where the new value of Q that is provided at the output of the register is obtained for processing.

Figure 11:
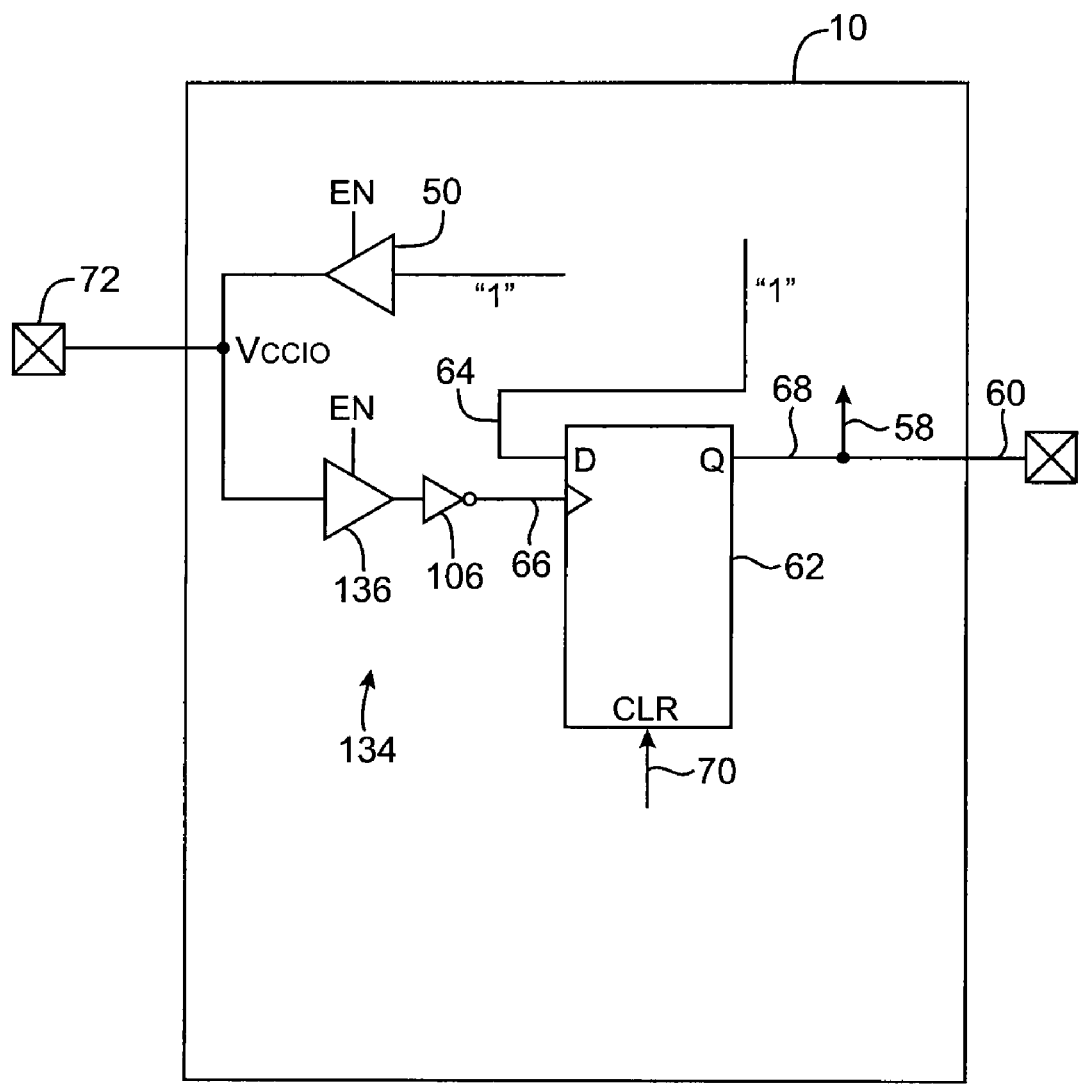
FIG. 11 is a diagram of an illustrative register-based positive power supply voltage sag measurement circuit in accordance with the present invention.

Sometimes it is desirable to make noise measurements on Vccio and Vssio without using an external voltage reference source. An illustrative noise measurement circuit 134 that may be used to perform Vcc sag measurements without using a voltage reference is shown in FIG. 11. In the arrangement of FIG. 11, the programmable logic device 10 is programmed with configuration data that turns on buffers 50 and 136. Buffer 50 is preferably a single-ended output buffer. Buffer 136 is preferably a single-ended input buffer. If desired, buffer 136 may be implemented with a differential input buffer with one input tied to ground by proper configuration of a programmable circuit. The input of buffer 50 and the data input 64 of register 62 are provided with a logic high signal (e.g., Vccio). The logic high signal at the input of buffer 50 causes buffer 50 to produce a Vccio output signal at its output. The Vccio signal appears on dummy pin 72 and the input of buffer 136.

Because buffer 136 is on, the Vccio signal propagates to the output of buffer 136, where it is inverted by inverter 106. Inverter 106 and the rest of the path between the output of buffer 136 and the input 66 of register 62 may be formed from programmable logic circuitry that has been configured by loading configuration data into the programmable logic device 10. If Vccio remains near its nominal value, the output of buffer 136 will remain high and the output of inverter 106 will remain low. The register output Q in FIG. 11 will therefore remain at 0 (its cleared state). If, however, the value of Vccio becomes corrupted, the output of buffer 136 will go low, forcing the output of inverter 106 and the clock input 66 of register 62 to go high. This clocks the register 62 and passes the logic high value on the input 64 to Q output 68. When Q goes high, significant noise is present (i.e., noise sufficient to cause the Vccio level to drop below the logic low threshold of the input buffer 136). The value of Q may be provided to internal circuitry via line 58 or external circuitry using pin 60.

Figure 12:
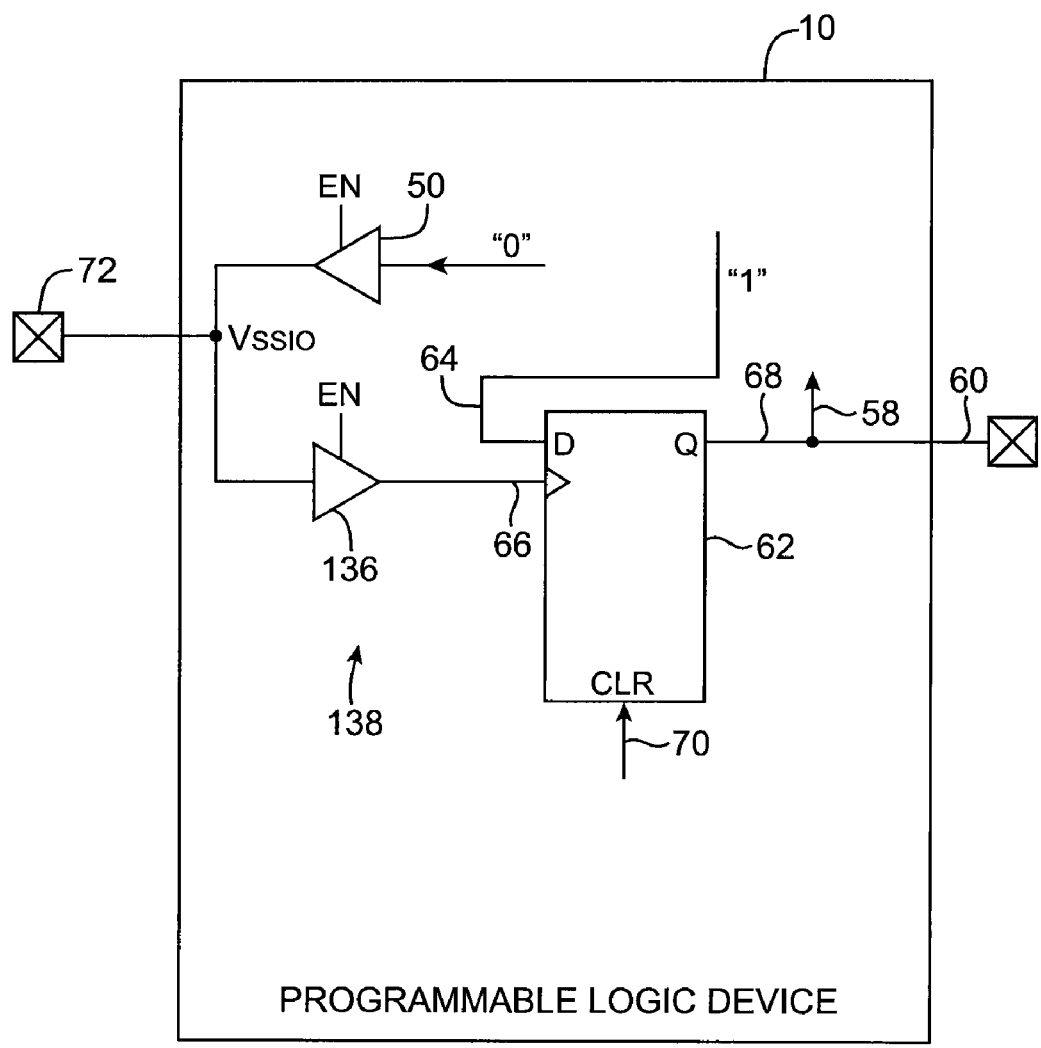
FIG. 12 is a diagram of an illustrative register-based ground bounce measurement circuit in accordance with the present invention.

Vss bounce may be measured without using an external voltage reference by using the circuit 138 of FIG. 12. Before measurements are made, the programmable logic device 10 is configured to form the circuit 138 (e.g., by loading configuration data into device 10 from an external source). The configuration data turns on buffers 50 and 136. The configuration data also causes the input of buffer 50 to be provided with a logic low signal. The logic low at the input of buffer 50 causes buffer 50 to provide Vssio at its output. A logic high signal is provided to the data input of register 62.

The Vssio signal at the output of buffer 50 appears on dummy pin 72 and the input of buffer 136. Buffer 136 is on, so the Vssio signal propagates to the output of buffer 136 and to the clock input of register 62. The clear line 70 is used to apply an internal or external clear signal to register 62 to initialize register 62.

If Vssio remains near its nominal value, the output of buffer 136 will remain low. The register output Q will therefore remain at 0 (its cleared state). If the value of Vssio becomes corrupted (i.e., the noise on Vssio is significant enough that it appears to be a logic high rather than a logic low), the output of buffer 136 will go high. When the output of buffer 136 goes high, the clock input 66 of register 62 goes high. This clocks the register 62 and passes the logic high value on the input 64 to Q output 68. The value of Q may be provided to internal circuitry via line 58 or external circuitry using pin 60 to indicate that significant noise has been detected on the Vssio line.

Figure 13:
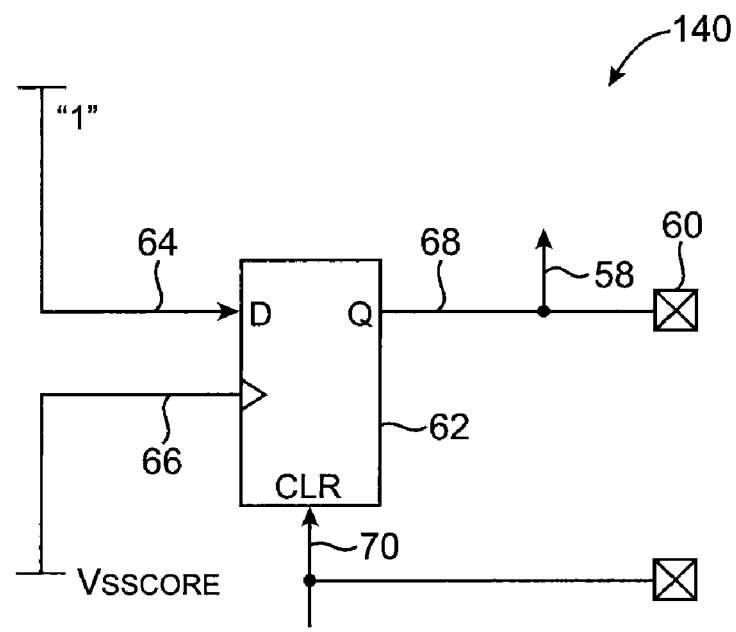
FIG. 13 is a diagram of an illustrative circuit for making ground supply noise measurements without consuming I/O pins in accordance with the present invention.
Figure 14:
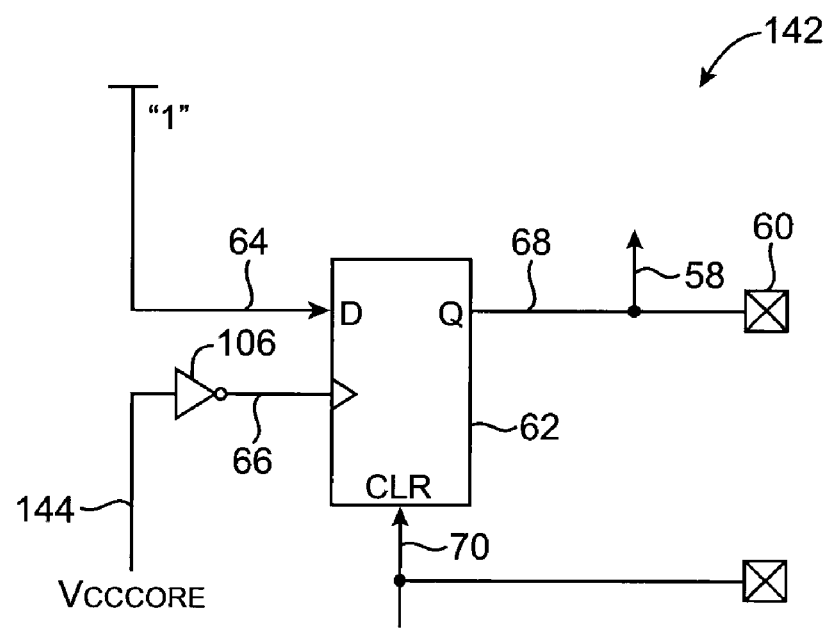
FIG. 14 is a diagram of an illustrative circuit for making positive power supply noise measurements without consuming I/O pins in accordance with the present invention.

If desired, noise in core power supply voltages Vcccore and Vsscore can be measured without using an external voltage reference. An illustrative circuit 140 for measuring Vsscore noise (ground bounce) is shown in FIG. 13. An illustrative circuit 142 for measuring Vcccore noise (Vcc sag) is shown in FIG. 14. Programmable logic device integrated circuits 10 are programmed to form circuits 140 and 142. Circuits 140 and 142 contain core logic registers 62 that are initialized by applying a clear signal to clear input 70. Clear signals may be received from an internal or external source.

In circuit 140 of FIG. 13, the programmable circuitry of the programmable logic device 10 has been configured to route the ground Vsscore to clock input 66 of register 62. The data input 64 of register 62 is provided with a logic "1". The Q output of register 62 will remain low unless the magnitude of Vsscore bounces so much that it exceeds the logic high threshold level for register 62. When Vsscore rises this much, it acts as a logic high and clocks the logic one on input 64 to the Q output 68. The Q output is provided to internal circuitry via line 58 and/or external circuitry via pin 60. By monitoring the value of Q, severe Vsscore noise (i.e., Vsscore levels that are high enough to be mistaken for valid Vcccore levels) can be detected.

In circuit 142 of FIG. 14, the programmable circuitry of the programmable logic device 10 has been configured to route the positive power supply Vcccore to line 144 and inverter 106. Inverter 106 inverts the value of Vcccore to produce a logic low. The logic low at the output of inverter 106 is applied to the clock input 66 of register 62. When Vcccore sags significantly, it appears as if Vcccore is a logic low value. As a result, the output of inverter 106 goes high. The logic high from inverter 106 clocks register 62 and causes the logic one on input 64 to appear at Q output 68. A high value of Q is indicative of severe noise on Vcccore (i.e., sufficient noise that Vcccore appears as though it is a logic low, rather than a logic high).

Information on monitored power supply noise conditions can be used for testing or for control functions. An example of a system in which power supply noise data is used for control functions is shown in FIG. 15.

Figure 15:
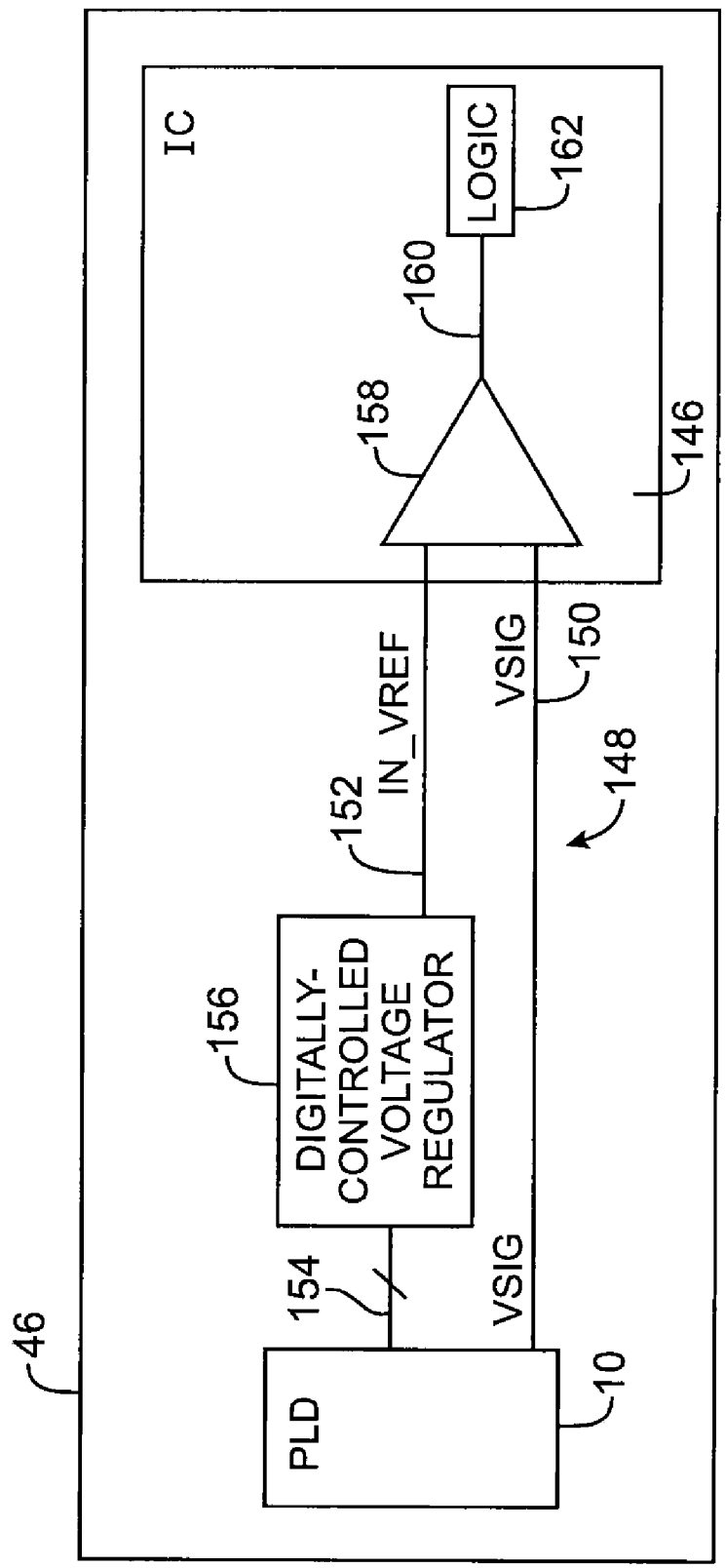
FIG. 15 is a diagram showing how control signals from a programmable logic device integrated circuit with power supply noise measurement capabilities can be used to control other integrated circuits such as an integrated circuit containing a controllable input buffer in accordance with the present invention.

In the example of FIG. 15, programmable logic device 10 communicates with another integrated circuit 146 over a communications path 150. Path 150 may be formed from conductive traces on a circuit board 46. If desired, programmable logic device 10 and integrated circuit 146 may be located on different circuit boards or other mounting structures. In general, there may be multiple paths 150, but only one path 150 is shown in FIG. 15 to avoid over-complicating the drawings.

Integrated circuit 146 has a differential input buffer 158 that is operated in referenced single-ended signal mode. In this mode, the signal received on line 150 is a data signal. The signal received on line 152 is a reference signal IN_VREF that controls buffer 158. The value of IN_VREF can be adjusted to optimize data reception.

Figure 16:
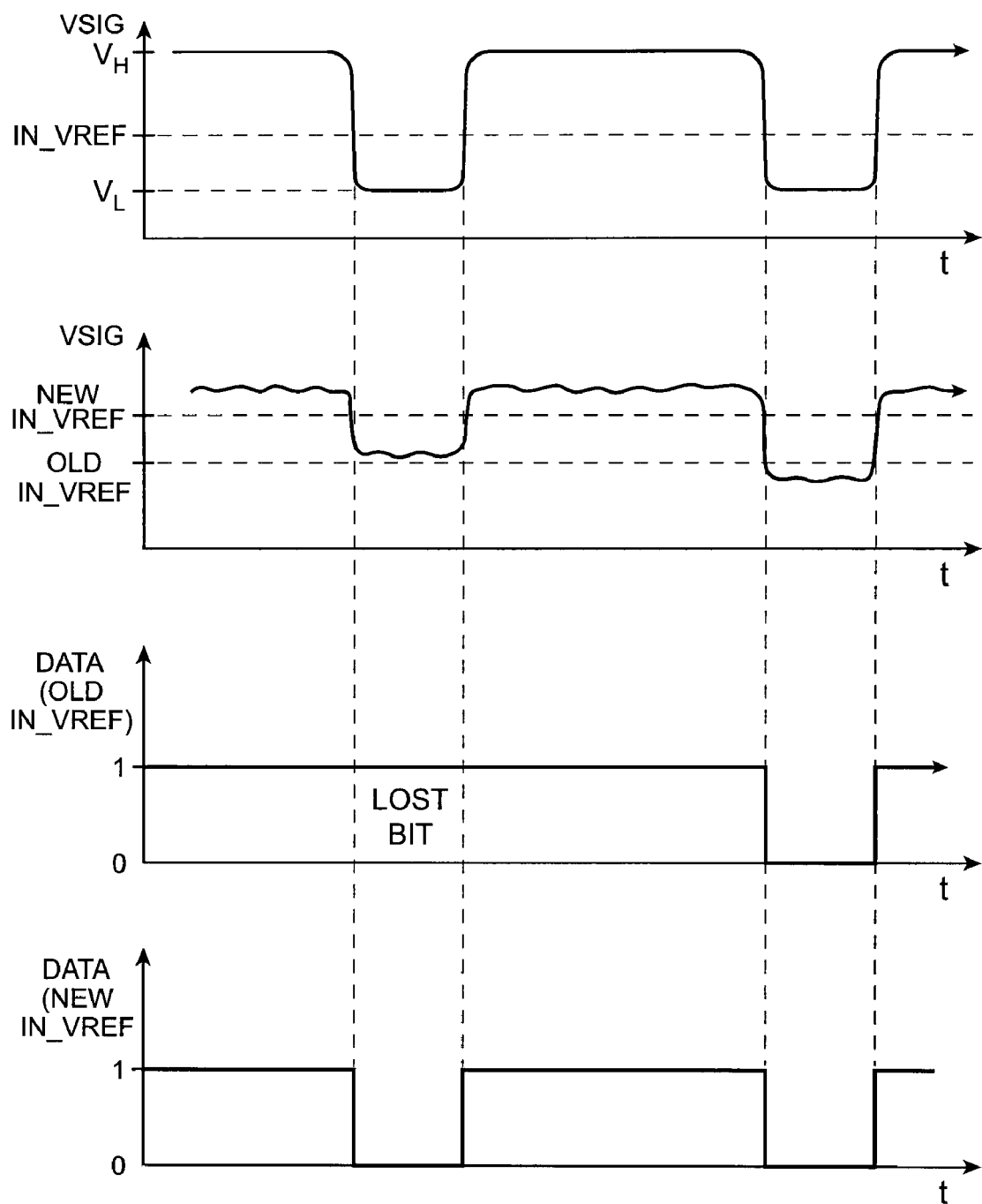
FIG. 16 is a diagram showing how the power supply noise measurements made in the system of FIG. 15 may be used to improve data link performance in accordance with the present invention.

The first trace in FIG. 16 shows a typical data signal VSIG that is received at buffer 158 from programmable logic device 10 over line 150. VSIG is plotted as a function of time. In this example, there are two logic low data pulses. The value of IN_VREF for optimum data reception by buffer 158 lies midway between the magnitudes $V_H$ and $V_L$, which are the maximum and minimum values for VSIG. In the illustrative first trace of FIG. 16, there is very little noise present on the data signal, so $V_L$ and $V_H$ are well separated. The value of IN_VREF is at the midway (average) point between $V_H$ and $V_L$ to ensure that buffer 158 processes the data received on line 150 correctly.

The situation changes when there is power supply noise in the system. This type of situation is shown in the second trace of FIG. 16. As illustrated by the jagged appearance of the second trace, both the positive power supply voltage and ground voltage in the programmable logic device 10 have noise, so the VSIG signal quality is low. Moreover, in this example, there is an unequal amount of noise on Vccio and Vssio. In particular, Vccio remains near its previous level, whereas Vssio is raised considerably due to noise. As a result, the lower limit of the VSIG signal is higher than the original VREF value used in the example of the first trace. (The value of IN_VREF in the first trace of FIG. 16 is labeled OLD IN_VREF in the second trace to make this relationship clear.)

If the value of OLD IN_VREF is supplied to buffer 158 over line 152 of FIG. 15, the buffer 158 will not accurately recover the data bits in the VSIG data stream, because some of the VSIG signal will exceed the value of OLD IN_VREF. As shown in the third trace of FIG. 16, this will result in lost bits.

If, however, the value of IN_VREF is updated to NEW IN_VREF as shown in the second trace of FIG. 16 to reflect the power supply noise conditions at the programmable logic device, the buffer 158 will properly recover the transmitted data on line 150. As shown in the fourth trace of FIG. 16, in the present example, both data bits will be properly received when the value of NEW IN_VREF is provided over line 152 to buffer 158.

The value of IN_VREF may be provided to integrated circuit 146 using any suitable technique. With the illustrative arrangement of FIG. 15, an external digitally-controlled voltage regulator 156 is mounted in the path 150 between programmable logic device 10 and integrated circuit 146. The digitally-controlled voltage regulator 156 produces an output voltage on line 152 in response to digital control signals received over one or more digital control lines in path 154. The control signals for regulator 156 may be generated by programmable logic device 10 based on an internal real-time analysis of the noise levels on Vccio and Vssio.

With the circuit of FIG. 15, the I/O buffers such as buffers 50 and 52 of FIG. 4 and the other noise monitoring circuitry 56 in programmable logic device 10 produce control signals that control an input buffer 158 at the far end of a communications link. The control signals initially take the form of a digital signal representation of IN_VREF (on path 154). Regulator circuitry 156 converts this digital version of IN_VREF into an analog voltage IN_VREF that is conveyed to input buffer 158 via line 152 in path 150.

The arrangement of FIG. 15 is merely illustrative. For example, a resistor-based controllable voltage source may be used to supply the IN_VREF signal to buffer 158 if desired. Moreover, any suitable control signals may be generated based on the power supply measurements made at the programmable logic device 10. The use of noise monitoring circuitry to generate IN_VREF control signals for controlling a differential input buffer operating in referenced single-ended mode is given as an example.

The foregoing is merely illustrative of the principles of this invention and various modifications can be made by those skilled in the art without departing from the scope and spirit of the invention.

What is claimed is:

1. Circuitry on a programmable logic device integrated circuit that measures power supply noise, comprising:
   first and second input-output pins;
   input-output circuitry including a differential input buffer that compares a power supply voltage to a reference voltage to detect noise, wherein the differential input buffer comprises first and second inputs that are respectively coupled to the first and second input-output pins; and
   monitoring circuitry that receives output signals from the differential input buffer and that provides a corresponding monitoring circuit output that is indicative of noise conditions on the power supply voltage.

2. The circuitry defined in claim 1 wherein the input-output circuitry comprises an output buffer, wherein the output buffer has an output equal to the power supply voltage, and wherein the output buffer output is electrically coupled to the differential input buffer.

3. The circuitry defined in claim 1 wherein the output buffer and input buffer have enable inputs and receive enable signals that turn the output buffer and input buffer on, wherein the output buffer has an output, and wherein turning the output buffer and input buffer on configures the input-output circuitry so that the output buffer output is connected to an input of the differential input buffer.

4. The circuitry defined in claim 1 wherein the input-output circuitry includes an output buffer, wherein the differential input buffer has first and second differential inputs, wherein the first differential input receives the power supply voltage from the output buffer and wherein the second differential input receives the reference voltage.

5. The circuitry defined in claim 1 wherein the monitoring circuitry comprises a register having a data input and a clock input and wherein the output signals from the differential input buffer are provided to the clock input.

6. The circuitry defined in claim 1 further comprising an inverter, wherein the monitoring circuitry comprises a register having a data input and a clock input and wherein the output signals from the differential input buffer are provided to the clock input after being inverted by the inverter.

7. The circuitry defined in claim 1, wherein:
   the monitoring circuitry comprises a register having a data input and a clock input;
   the output signals from the differential input buffer are provided to the clock input;
   the differential input buffer has first and second inputs;
   the input-output circuitry comprises an output buffer having an input and an output;
   the output of the output buffer is connected to the first input of the differential input buffer;
   the second input of the differential input buffer receives the reference voltage; and
   a logic high is provided to the input of the output buffer that directs the output buffer to provide a positive power supply voltage on the output buffer output.

8. The circuitry defined in claim 1, wherein:
   the monitoring circuitry comprises a register having a data input and a clock input;
   the output signals from the differential input buffer are provided to the clock input;
   the differential input buffer has first and second inputs;
   the input-output circuitry comprises an output buffer having an input and an output;
   the output of the output buffer is connected to the first input of the differential input buffer;
   the second input of the differential input buffer receives the reference voltage; and
   a logic low is provided to the input of the output buffer that directs the output buffer to provide a ground power supply voltage on the output buffer output.

9. The circuitry defined in claim 1, wherein:
   the monitoring circuitry comprises a register having a data input and a clock input;
   the output signals from the differential input buffer are provided to the clock input;
   the differential input buffer has first and second inputs;
   the input-output circuitry comprises an output buffer having an input and an output;
   the output of the output buffer is connected to the first input of the differential input buffer;
   the second input of the differential input buffer receives the reference voltage;
   a logic signal is provided to the input of the output buffer that directs the output buffer to provide the power supply voltage on the output buffer output; and
   a logic high is provided to the data input.

10. The circuitry defined in claim 1, wherein:
    the monitoring circuitry comprises a register having a data input and a clock input and an output;
    the output signals from the differential input buffer are provided to the clock input;
    the differential input buffer has first and second inputs;
    the input-output circuitry comprises an output buffer having an input and an output;
    the output of the output buffer is connected to the first input of the differential input buffer;
    the second input of the differential input buffer receives the reference voltage;

a logic signal is provided to the input of the output buffer that directs the output buffer to provide the power supply voltage on the output buffer output;

a logic high is provided to the data input;

the output of the differential input buffer is coupled to the clock input; and when noise is present on the power supply voltage, the output of the differential input buffer clocks the register and causes the logic high that was provided to the data input to appear at the register output.

11. The circuitry defined in claim 1 wherein the second input-output pin is unconnected to active circuitry external to the programmable logic device.

12. The circuitry defined in claim 1 wherein the first input-output pin receives the reference voltage and wherein the second input-output pin is unconnected to active circuitry external to the programmable logic device.

13. A method for measuring power supply noise in a programmable logic device having input-output circuitry containing an output buffer having an input and an output and containing a differential input buffer having first and second differential inputs and an output, the method comprising:

configuring the programmable logic device to implement noise monitoring circuitry;

configuring the programmable logic device so that the output buffer output supplies a power supply voltage to the first differential input and so that the output of the differential input buffer is routed to the noise monitoring circuitry;

using the differential input buffer to compare the power supply voltage at the first differential input to a reference voltage received at the second differential input and to provide a corresponding output signal at the output of the differential input buffer based on the comparison; and using the noise monitoring circuitry to receive the output signal from the differential input buffer to characterize noise on the power supply voltage.

14. The method defined in claim 13 wherein the noise monitoring circuitry comprises a register having a data input, a clock input, and an output, the method further comprising:

receiving a logic signal at the data input;

receiving the output signal from the differential input buffer at the clock input; and in response to a signal transition on the clock input, providing the logic signal on the data input to the register output.

15. The method defined in claim 13 further comprising:

using a voltage reference circuit to provide the reference voltage to the second differential input.

16. The method defined in claim 13 further comprising:

configuring the programmable logic device to provide a logic high signal to the input of the output buffer that directs the output buffer to provide a positive power supply voltage at its output.

17. The method defined in claim 13 further comprising:

configuring the programmable logic device to provide a logic low signal to the input of the output buffer that directs the output buffer to provide a ground power supply voltage at its output.

18. The method defined in claim 13 further comprising:

configuring the programmable logic device so that the output of the register is routed to an output pin.

19. The method defined in claim 13 further comprising using the noise monitoring circuitry to control an integrated circuit other than the programmable logic device.

20. The method defined in claim 13 further comprising varying the reference voltage while using the noise monitoring circuitry to receive the output signal from the differential input buffer to characterize noise on the power supply voltage over a range of voltage levels.

* * * * *